(12) United States Patent
Hayakawa et al.

(10) Patent No.: US 10,138,541 B2
(45) Date of Patent: Nov. 27, 2018

(54) METHOD FOR PRODUCING SUBSTRATE WITH TRANSPARENT ELECTRODE, AND SUBSTRATE WITH TRANSPARENT ELECTRODE

(71) Applicant: KANEKA CORPORATION, Osaka-shi, Osaka (JP)

(72) Inventors: Hironori Hayakawa, Settsu (JP); Takashi Kuchiyama, Settsu (JP); Hiroaki Ueda, Settsu (JP)

(73) Assignee: Kaneka Corporation, Osaka-shi, Osaka (JP)

( * ) Notice: Subject to any disclaimer, the term of this patent is extended or adjusted under 35 U.S.C. 154(b) by 677 days.

(21) Appl. No.: 14/424,961

(22) PCT Filed: Aug. 23, 2013

(86) PCT No.: PCT/JP2013/072619
§ 371 (c)(1),
(2) Date: Feb. 27, 2015

(87) PCT Pub. No.: WO2014/034575
PCT Pub. Date: Mar. 6, 2014

(65) Prior Publication Data
US 2015/0225837 A1    Aug. 13, 2015

(30) Foreign Application Priority Data

Aug. 31, 2012  (JP) ................. 2012-191776

(51) Int. Cl.
| | | |
|---|---|---|
| *C23C 14/34* | (2006.01) | |
| *C23C 14/08* | (2006.01) | |
| *G06F 3/041* | (2006.01) | |
| *C23C 14/58* | (2006.01) | |
| *H05K 1/02* | (2006.01) | |

(Continued)

(52) U.S. Cl.
CPC ........... *C23C 14/086* (2013.01); *C23C 14/34* (2013.01); *C23C 14/5806* (2013.01);

(Continued)

(58) Field of Classification Search
CPC .................................................. C23C 14/086
See application file for complete search history.

(56) References Cited

U.S. PATENT DOCUMENTS 5,401,701 A * 3/1995 Ogawa .................. C01G 15/00
                                                      204/298.13
5,783,049 A * 7/1998 Bright .................... G02B 1/111
                                                      204/192.14

(Continued)

FOREIGN PATENT DOCUMENTS

| JP | H04224162 A | 8/1992 |
| JP | H09209119 A | 8/1997 |

(Continued)

OTHER PUBLICATIONS

International Bureau of WIPO, International Preliminary Report on Patentability Issued in International Application No. PCT/JP2013/072619, dated Mar. 12, 2015, WIPO, 7 pages.

(Continued)

*Primary Examiner* — Jason Berman
(74) *Attorney, Agent, or Firm* — Alleman Hall Creasman & Tuttle LLP (57) ABSTRACT

A resin substrate with a transparent electrode having a low resistance, and a manufacturing method thereof including: a deposition step wherein a transparent electrode layer of indium tin oxide is formed on a transparent film substrate by a sputtering method, and a crystallization step wherein the transparent electrode layer is crystallized. In the deposition step, a sputtering deposition is performed using a sputtering target containing indium oxide and tin oxide, while a sputtering gas containing argon and oxygen is introduced into a chamber. It is preferable that an effective exhaust rate S, calculated from a rate Q of the sputtering gas introduced into the chamber and a pressure P in the chamber by a formula S (L/second)=1.688×Q (sccm)/P (Pa), is 1,200-5,000 (L/sec- (Continued)

ond). It is also preferable that a resistivity of the transparent electrode layer is less than $3 \times 10^{-4}$ Ωcm.

10 Claims, 1 Drawing Sheet

(51) Int. Cl.
    *H05K 1/03* (2006.01)
    *H05K 3/16* (2006.01)
    *H05K 3/38* (2006.01)
    *H05K 1/09* (2006.01)
    *H05K 3/22* (2006.01)

(52) U.S. Cl.
    CPC ........... *G06F 3/041* (2013.01); *H05K 1/0274* (2013.01); *H05K 1/0306* (2013.01); *H05K 3/16* (2013.01); *H05K 3/388* (2013.01); *H05K 1/09* (2013.01); *H05K 3/22* (2013.01); *H05K 2201/0104* (2013.01); *H05K 2201/0108* (2013.01); *H05K 2201/0175* (2013.01); *H05K 2201/0179* (2013.01); *H05K 2201/0326* (2013.01); *H05K 2203/1194* (2013.01)

(56) References Cited

U.S. PATENT DOCUMENTS

| | | |
|---|---|---|
| 2005/0287724 A1 | 12/2005 | Wakairo et al. |
| 2008/0237034 A1 | 10/2008 | Wakairo et al. |
| 2009/0286071 A1* | 11/2009 | Sasa .................. C08J 7/04 428/336 |
| 2010/0200395 A1* | 8/2010 | Dietrich .............. C23C 14/0042 204/192.15 |
| 2013/0206590 A1* | 8/2013 | Baluch ................ C04B 35/457 204/298.13 |
| 2013/0213703 A1 | 8/2013 | Kawaguchi et al. |

FOREIGN PATENT DOCUMENTS

| | | |
|---|---|---|
| JP | H10330916 A | 12/1998 |
| JP | H11172416 A | 6/1999 |
| JP | 2002367436 A | 12/2002 |
| JP | 2004214184 A | 7/2004 |
| JP | 2004332030 A | 11/2004 |
| JP | 2007203668 A | 8/2007 |
| JP | 2007214301 A | 8/2007 |
| JP | 2010061837 A | 3/2010 |
| JP | 2011018623 A | 1/2011 |
| JP | 2012103958 A | 5/2012 |
| WO | 2010140275 A1 | 12/2010 |

OTHER PUBLICATIONS

ISA Japanese Patent Office, International Search Report of PCT/JP2013/072619, WIPO, dated Oct. 8, 2013, 4 pages.

* cited by examiner

US 10,138,541 B2

METHOD FOR PRODUCING SUBSTRATE WITH TRANSPARENT ELECTRODE, AND SUBSTRATE WITH TRANSPARENT ELECTRODE

TECHNICAL FIELD

The invention relates to a substrate with a transparent electrode which is suitably used for a touch panel, and a manufacturing method thereof.

BACKGROUND ART

A substrate with a transparent electrode, in which a transparent conductive film is provided on a transparent substrate such as a transparent film or glass, is used for a touch panel incorporated in a mobile phone, a game machine, a computer or the like, or a display device of electronic paper, a PDA or the like. As a material of the transparent conductive film of the substrate with a transparent electrode, a conductive oxide such as indium tin oxide (ITO) is widely used. When the substrate with a transparent electrode is used for position detection of a capacitance touch panel, the transparent conductive film (transparent electrode) is patterned. Each pattern electrode is electrically connected to control means such as an IC through a routing wiring provided on a frame edge region at the periphery of a display, and position detection is performed based on a capacitance of each pattern electrode. When the resistance of the electrode increases, the sensitivity of position detection and the response speed decrease, and therefore the demand for a transparent conductive electrode having a lower resistance has increased.

On the other hand, with higher definition of displays, it has been required to reduce the pattern widths of electrodes for improving accuracy of position detection. A conductive oxide such as ITO has a large absorption of light having a wavelength of 400 nm or less, so that when the thickness increases, the screen image is colored due to absorption of short-wavelength light, leading to deterioration of visibility. Thus, the thickness of the transparent conductive film is preferably as small as possible. However, when the width and the thickness of the electrode decrease, the cross-sectional area decreases, leading to an increase in resistance of the electrode. When the display area increases, the distance between frame edges increases, and therefore the distance of the electrode increases, so that even though the resistivity of the transparent electrode remains the same, the resistance of the electrode increases.

Thus, in order to produce a display having a high definition and a large area without reducing the position detection sensitivity and the response speed, it is necessary to form a transparent conductive film having a lower resistivity on a substrate. For example, Patent Document 1 describes that when a film is formed by sputtering on a glass substrate heated to 200° C. or higher while a surface magnetic field of a target is adjusted, a low-resistance ITO film having a resistivity of $1.1 \times 10^{-4}$ to $1.2 \times 10^{-4}$ Ωcm is obtained.

As a transparent substrate, a resin substrate (film) has come into use in place of glass from the viewpoint of weight reduction of devices, ease of handling, high formability of a transparent conductive film by sputtering, and so on. For example, Patent Document 2 discloses that when an oxygen partial pressure, a water partial pressure and so on during deposition are controlled while the content of tin oxide in a target used for deposition by sputtering is set to 8% by weight or less, a low-resistance ITO film having a resistivity of about $3 \times 10^{-4}$ to $4 \times 10^{-4}$ Ωcm can be formed on a resin substrate.

PRIOR ART DOCUMENTS

Patent Documents

Patent Document 1: JP-A-2011-18623
Patent Document 2: WO 2010/140275

SUMMARY OF THE INVENTION

Problems to be Solved by the Invention

A resin substrate has a low heat resistance as compared to glass, so that the heating temperature during processing such as deposition of a transparent electrode is limited. Therefore, when a resin substrate is used, an amorphous conductive oxide thin film is formed on a substrate at a low temperature, and then heated under an oxygen atmosphere to crystallize the conductive oxide, thereby reducing the resistance. However, it is necessary that the heating temperature for crystallization be made lower than the heat-resistant temperature of the resin substrate, and therefore it is difficult to perform sufficient crystallization.

Due to limitation of the processing temperature as described above, currently it is hard to make the resistivity of the transparent electrode formed on the resin substrate be less than $3 \times 10^{-4}$ Ωcm as described in examples and so on in Patent Document 2. Thus, a substrate with a transparent electrode, which has a low resistance as in the case where a glass substrate is used, has not been obtained.

As described above, the thickness of the transparent electrode is preferably as small as possible for reducing coloring of a screen image and deterioration of visibility. However, when a metal oxide such as a transparent electrode is deposited to form a film by a sputtering method, a local deviation in composition, a variation in crystal nucleus generation rate, and the like easily occur, so that the resistivity tends to increase, in an initial deposition region where the thickness is small.

Thus, it is difficult to form a transparent electrode having a small thickness and a low resistance on a film substrate, so that a substrate with a transparent electrode using a film substrate is hindered from being applied to touch panels of large displays and high-definition displays. In view of the above-mentioned situations, an object of the present invention is to provide a substrate with a transparent electrode, in which a transparent electrode having a small thickness and a low resistance is provided on a film substrate.

Means for Solving the Problems

The present invention relates to a method for manufacturing a substrate with a transparent electrode, in which a transparent electrode layer is provided on a transparent film substrate. The manufacturing method of the present invention includes a step of forming on a transparent film substrate a transparent electrode layer formed of indium tin oxide using a sputtering method (deposition step); and a step of crystallizing the transparent electrode layer (crystallization step).

In formation of the transparent electrode layer on the transparent substrate, a sputtering gas containing argon and oxygen is introduced into a chamber. The rate Q of the sputtering gas introduced into the chamber is preferably 200 sccm to 1500 sccm. The pressure P in the chamber is preferably 0.2 to 0.6 Pa.

In the manufacturing method of the present invention, the effective exhaust rate S determined from the gas introduction rate Q and the pressure P in the deposition step is preferably 1200 to 5000 (L/second).

$$S(L/second)=1.688 \times Q(sccm)/P(Pa) \quad \text{(Formula 1).}$$

According to the above-described method, a substrate with a transparent electrode including a low-resistivity transparent electrode layer is obtained, in which the resistivity thereof, for example, is less than $3.0 \times 10^{-4}$ Ωcm after crystallization.

An explanation of the aforementioned Formula 1 is made below.

When a gas is introduced at a flow rate Q (sccm) during evacuation of the chamber at an effective exhaust rate S (L/second), the number of gas molecules flowing into the chamber is equal to the number of gas molecules exhausted to the outside of the chamber in a steady state in which the pressure P is constant. Here, the number of molecules can be expressed using a pressure and a volume from the equation of state of an ideal gas: PV=nRT. Therefore, in a steady state, the product of the pressure of a gas flowing into the chamber and the flow rate of a gas per unit time is equal to the product of the pressure of an exhausted gas and the exhaust rate per unit time. Since the pressure of a gas exhausted from the chamber is equal to the chamber pressure, the relationship of PS=P'Q is satisfied where P is the chamber pressure and P' is the pressure in a gas supply apparatus. Herein, P'=1 atm (=101325 Pa), because the unit (sccm) of the gas flow rate Q is defined by the volume at 1 atm.

That is, the following formula is derived:

$$S(L/second)=Q(atm \cdot cc/minute)/P(Pa).$$

When units in this formula are converted in accordance with 1 (minute)=60 (seconds) and 1 (atm)=101325 Pa, and coefficients in the left and right sides are organized, the following relationship is obtained:

$$S(L/second)=1.688 \times Q(sccm)/P(Pa) \quad \text{(Formula 1).}$$

Here, the effective exhaust rate S in the present invention is compared to that in a conventional example. In examples in Patent Document 2 (WO 2010/140275), the argon flow rate is 130 sccm, and (although not specified) the oxygen flow rate is estimated to be 10 sccm or less. In examples in Patent Document 2, since the chamber pressure is 0.4 Pa, the effective exhaust rate is calculated to be less than 590 L/second, and the effective exhaust rate is approximately a half or lower as compared to that in the present invention.

In addition, the effective exhaust rate in Examples 8 to 10 in JP-A-2012-116184 is 591 (L/second), the effective exhaust rate in Examples 1 to 4 in JP-A-2010-153298 is 549 (L/second), the effective exhaust rate in Example 2 in JP-A-2011-129527 is 591 (L/second), the effective exhaust rate in Examples 1 and 2 in JP-A-2005-47949 is 844 (L/second), and the effective exhaust rate in Examples 1 to 3 in JP-A-2004-149884 is 450 (L/second).

Thus, the effective exhaust rate S in the prior technique is generally about 500 (L/second), and deposition is performed at an effective exhaust rate of less than 1000 (L/second) at most. When the chamber pressure is adjusted, it is a common practice to adjust the gas introduction rate so that the pressure is kept at a set value, and the effective exhaust rate is not adjusted.

On the other hand, the inventors have found that the effective exhaust rate during deposition of a transparent electrode layer has influences on film characteristics, and the inventors have optimized the range of the effective exhaust rate, thereby making it possible to provide a substrate with a low-resistance transparent electrode. The reason why the resistance of the transparent electrode is reduced by increasing the effective exhaust rate is not clear. One reason may be that since the gas introduction rate increases, the amount of impurities in the chamber decreases, and ingress of high-energy oxygen ions into the film is thereby reduced. In the film obtained in this manner, easy crystallization by heating after deposition may also contribute to a reduction in resistance.

When the chamber pressure is low, arch discharge occurs during sputtering, so that it tends to be difficult to obtain a homogeneous film. On the other hand, when the chamber pressure is excessively high, energy of the sputtering particles is lost, so that it tends to be difficult to form a dense film. Therefore, the chamber pressure P during deposition is preferably 0.2 to 0.6 Pa.

When the rate Q of the sputtering gas introduced into the chamber is set within a range of 200 to 1500 sccm, the chamber pressure is kept in this range even if the effective exhaust rate S is high, and ingress of high-energy oxygen ions, which are generated from a target during deposition, into the film is suppressed.

In the manufacturing method of the present invention, a value obtained by dividing the effective exhaust rate S by the area of the sputtering target is preferably 1 L/second·cm$^2$ to 5 L/second·cm$^2$. An exhaust rate cycle Ec obtained by dividing the effective exhaust rate S by the chamber volume V is preferably 0.4/second or more.

The thickness of the transparent electrode layer is preferably 10 to 20 nm. In one embodiment of the present invention, the transparent film substrate includes an inorganic insulating layer such as $SiO_x$ (x=1.8 to 2.0) on a surface on which a transparent electrode layer is formed.

In the manufacturing method of the present invention, the temperature of the substrate in the deposition step is preferably 100° C. or lower. Preferably, heating is performed at a temperature of 200° C. or lower in the crystallization step.

In one embodiment, the content of tin oxide in the sputtering target is 3 to 13% by weight based on the total amount of indium oxide and tin oxide.

Effects of the Invention

According to the present invention, a substrate with a transparent electrode, in which a transparent electrode layer having a low resistivity is provided on a film substrate, is obtained. The substrate with a transparent electrode according to the present invention can be used as, for example, a position detecting electrode for a capacitance touch panel.

MODE FOR CARRYING OUT THE INVENTION

Figure 1:
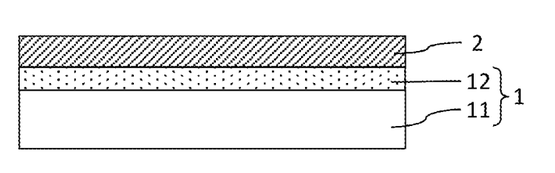
FIG. 1 is a sectional view of a substrate with a transparent electrode according to one embodiment.

FIG. 1 is a sectional view of a substrate with a transparent electrode according to one embodiment. The substrate with a transparent electrode in FIG. 1 includes a transparent electrode layer 2, which is formed of indium tin oxide (ITO), on a transparent film substrate 1 including an inorganic insulating layer 12 on a transparent film substrate 11. In FIG. 1, the dimensional relationship of thickness and so on is appropriately changed for clarification and simplification of the drawing, and does not show an actual dimensional relationship.

[Transparent Film Substrate]

As the transparent film substrate 11 that forms the transparent film substrate 1, one that is colorless and transparent in a visible light region is used. The softening temperature of a versatile transparent film is generally 200° C. or lower. A transparent polyimide or the like has a high softening temperature of 200° C. or higher, but is very expensive. Therefore, as a material of the transparent film substrate, one having a softening point of 50 to 200° C. is used, and examples thereof include polyester resins such as polyethylene terephthalate (PET), polybutylene terephthalate (PBT) and polyethylene naphthalate (PEN), a cycloolefin-based resin, a polycarbonate resin and a cellulose-based resin. Among them, polyethylene terephthalate, the cycloolefin-based resin, and the like are suitably used.

The thickness of the transparent film substrate 1 is not particularly limited, but is preferably 10 to 400 µm, more preferably 20 to 300 µm. The film substrate is harder to be deformed due to deposition as its thickness increases, but when the thickness of the film substrate is excessively large, flexibility is lost, so that deposition by a roll-to-roll method tends to be difficult. When the thickness of the film substrate falls within the above-mentioned range, deformation of the film substrate by heat is suppressed, so that a transparent electrode layer can be formed with good productivity on a substrate by a roll-to-roll method.

The transparent film substrate may include an inorganic insulating layer on a surface on which a transparent electrode layer is formed. In FIG. 1, the transparent film substrate 1 includes an inorganic insulating layer 12 on a surface of the transparent film substrate 11 on which the transparent electrode layer 2 is formed. When the inorganic insulating layer 12 is provided on a surface on which the transparent electrode layer 2 is formed, adhesion between the transparent film substrate 1 and the transparent electrode layer 2 can be improved. The inorganic insulating layer 12 can act as a gas barrier layer that suppresses volatilization of moisture and organic substances from the transparent film substrate 11 in formation of the transparent electrode layer 2 on the inorganic insulating layer 12, and can also act as a ground layer for film growth. Therefore, by use of the transparent film substrate 1 in which the inorganic insulating layer 12 is provided on the transparent film substrate 11, the resistance of a transparent electrode layer formed on the inorganic insulating layer 12 tends to be further reduced.

The material of the inorganic insulating layer 12 is preferably an oxide material. The oxide material is preferably one that is colorless and transparent at least in a visible light region and has a resistivity of $1 \times 10^{-2}$ Ω·cm or more, and for example, an oxide material of at least one element selected from the group consisting of Si, Nb, Ta, Ti, Zr and Hf is suitably used. Among them, silicon oxide is preferred, and particularly $SiO_x$ (x=1.8 to 2.0) is preferred from the viewpoint of transparency.

The inorganic insulating layer 12 may include only one layer, or may include two or more layers. When the inorganic insulating layer 12 includes two or more layers, the thickness and the refractive index of each layer can be adjusted to optimize the transmittance and the reflectivity of the substrate with a transparent electrode, improving visibility of the display. When the inorganic insulating layer 12 includes two or more layers, combination of the layers is not particularly limited, but the inorganic insulating layer just below the transparent electrode layer 2 is preferably silicon oxide.

The thickness of the inorganic insulating layer 12 is not particularly limited, but is preferably 3 nm to 200 nm, more preferably 5 nm to 150 nm. When the inorganic insulating layer 12 includes two or more layers, the total thickness preferably falls within the above-described range.

The method for forming the inorganic insulating layer is preferably a sputtering method because a homogeneous film having reduced impurities can be formed, and the deposition rate is high, leading to excellent productivity. As a sputtering target, a metal, a metal oxide, a metal carbide or the like can be used. For the purpose of improving adhesion between the transparent film substrate 11 and the inorganic insulating layer 12, the surface of the transparent film substrate 11 can be subjected to a surface treatment before formation of the inorganic insulating layer 12. For the surface treatment, for example, a method is employed in which electrical polarity is imparted to the surface of a substrate to enhance adhesive strength, and specific examples thereof include corona discharge and plasma treatment. For the purpose of improving adhesion between the transparent film substrate 1 and the transparent electrode layer 2, the surface of the transparent film substrate 1 (surface of the inorganic insulating layer 12) may be subjected to the above-mentioned surface treatment.

[Transparent Electrode Layer]

<Deposition of Transparent Electrode Layer>

The transparent electrode layer 2 formed of indium tin oxide (ITO) is formed on the transparent film substrate 1 by a sputtering method. Preferably, the transparent electrode layer is formed using a roll-to-roll sputtering deposition apparatus. Roll-to-roll sputtering enables a transparent electrode layer to be formed on a transparent film with high productivity by a roll-to-roll method. When a roll-to-roll sputtering deposition apparatus is used, deposition of the inorganic insulating layer 12 on the transparent film substrate 11 and deposition of the transparent electrode 2 thereon can also be consecutively performed.

Preferably, a sintered body obtained from a solid dispersion of indium oxide and tin oxide is used as a sputtering target. The content of tin oxide in the target is preferably 3 to 13% by weight based on the total amount of indium oxide and tin oxide. When the content of tin oxide is low, it may be difficult to reduce the resistance because the density of carriers in the ITO film is small. When the content of tin oxide is high, it may be difficult to reduce the resistance because ITO is hard to be crystallized. When the content of tin oxide falls within the above-described range, the density of carriers in the ITO film is high, and ITO is easily crystallized, so that a low-resistance ITO transparent electrode is easily formed.

It is known that in sputtering deposition, water adsorbed into the chamber in opening of the chamber to air is incorporated in the film during deposition, and acts as an impurity. Therefore, during deposition of the transparent electrode layer, vacuum evacuation is preferably performed until the back pressure (chamber pressure before introduction of a sputtering gas) reaches $10^{-3}$ Pa or less. The back pressure can be found by reading the chamber pressure before introduction of a sputtering gas.

After the inside of the chamber is evacuated, sputtering deposition is performed while argon and oxygen are introduced into the chamber as a sputtering gas. In sputtering deposition, it is preferred to generate plasma using ions or electrons generated from the target. The introduction rate of argon in sputtering deposition is preferably 100 sccm to 1499 sccm, more preferably 200 sccm to 1200 sccm, further preferably 300 sccm to 900 sccm, especially preferably 450 sccm to 800 sccm.

Preferably, the oxygen introduction rate into the chamber is adjusted to decrease the resistance of the transparent electrode layer, depending on the introduction rate of argon, the chamber pressure, the power density and so on, and may be adjusted within a range of, for example, about 1 sccm to 100 sccm. For example, when the chamber volume is about 500 to 3500 L and the chamber pressure is about 0.2 to 0.4 Pa, the oxygen introduction rate that leads to the minimum resistance value of the transparent electrode layer is about 3 sccm to 6 sccm. When the chamber volume increases, the optimum oxygen introduction rate tends to increase. When the introduction rate of oxygen is excessively small, oxygen deficiency may occur in the ITO film to hinder electronic conduction. On the other hand, when the oxygen introduction rate is excessively large, excessive oxygen may catch electrons to reduce the concentration of carriers. Therefore, for reducing the resistance of the ITO transparent electrode layer, the oxygen flow rate is preferably optimized within the above-described range.

As a sputtering gas, a gas other than argon and oxygen (e.g., an inert gas such as hydrogen) may be introduced. The total introduction rate Q of the sputtering gas is preferably 200 sccm to 1200 sccm, more preferably 300 sccm to 900 sccm. The chamber P is preferably 0.2 to 0.6 Pa, more preferably 0.2 to 0.4 Pa.

As described above, in the present invention, the effective exhaust rate S determined from the gas introduction rate Q and the pressure P in accordance with the formula:

$$S(\text{L/second}) = 1.688 \times Q(\text{sccm})/P(\text{Pa}) \quad \text{(Formula 1)}$$

is preferably 1200 to 5000 L/second.

The effective exhaust rate can be adjusted to fall within the above-described range by modulating the capacity of exhausting means such as a vacuum pump used for evacuation of the chamber, the aperture of a valve provided in a flow channel (pipe) between the chamber and the exhausting means, and so on.

In the present invention, the resistance of the transparent electrode layer tends to be reduced by increasing the effective exhaust rate S. Although the reason for this is not clear, it is considered that since a cycle of exhausting a gas to the outside of the chamber after introducing the gas into the chamber and performing sputtering is short, impurities such as high-energy oxygen ions generated by sputtering are discharged before being incorporated in the film, so that ingress of impurities into the film is suppressed, thus contributing to a reduction in resistance. When the exhaust rate is excessively increased, it is necessary to increase the size of equipment such as a pump for exhaust, while a further reduction in resistance can be hardly expected. Therefore, the effective exhaust rate S is more preferably in the range of 2500 to 4000 L/second.

For shortening the cycle of exhausting a gas to the outside of the chamber after introducing the gas into the chamber and performing sputtering, the exhaust rate cycle Ec expressed using the effective exhaust rate S and the chamber volume V: Ec (/second)=S (L/second)/V (L) is preferably 0.4/second or more, more preferably 0.5/second or more, further preferably 0.7/second or more, especially preferably 1/second or more. Although the upper limit of the exhaust rate cycle Ec is not particularly limited, the upper limit of a practical value with an exhaust capacity and the like taken into consideration is about 2.5. The exhaust rate cycle Ec is preferably 2 or less, more preferably 1.5 or less.

The chamber volume V can be determined from the slope of a graph prepared by plotting the logarithm of the pressure p to the time t using the relationship of $p=p_0 \exp(-S/v)$ satisfied by the pressure p and the time t when the chamber is evacuated at a constant effective exhaust rate S. Here, $p_0$ is an initial pressure before the start of exhaust. In the present invention, the chamber volume is determined by plotting the pressure to the time under conditions (the number of rotations of the vacuum pump, the aperture of the valve, and the like) similar to those during deposition after the initial pressure is kept at $p_0=1$ Pa.

A value obtained by dividing the effective exhaust rate S (L/second) by the area ($cm^2$) of the sputtering target is preferably 1 to 5 (L/second·$cm^2$), more preferably 1.5 to 4.5 (L/second·$cm^2$). The deposition power density is preferably about 0.1 to 10 $W/cm^2$, more preferably 0.3 to 5 $W/cm^2$.

The substrate temperature during deposition of the transparent electrode layer may be in a range of temperatures at which the transparent film substrate remains heatproof. For example, the substrate temperature is preferably 100° C. or lower, more preferably −35° C. to 80° C., further preferably −20° C. to 60° C. When the substrate temperature is 100° C. or lower, volatilization of moisture and organic substances (e.g., oligomer components) from the film substrate is suppressed, so that ITO is easily crystallized, and the resistance of the transparent electrode layer tends to be reduced. When the substrate temperature is −35° C. or higher, a reduction in transmittance of the transparent electrode layer and embrittlement of the transparent film substrate are suppressed.

The thickness of the transparent electrode layer is not particularly limited. When the substrate with a transparent electrode is used for a position detecting electrode of a capacitance touch panel, the thickness of the transparent electrode layer is preferably about 10 nm to 30 nm. Generally, the thickness of the transparent electrode layer that is used for position detection of a capacitance touch panel is about 25 nm. On the other hand, according to the manufacturing method of the present invention, the resistivity of the ITO film can be reduced to, for example, less than $3\times10^{-4}$ Ωcm, and therefore even when the thickness is 20 nm or less, or even 17 nm or less, a low-resistance transparent electrode layer is obtained. Further, the thickness of the transparent electrode layer can be reduced, and therefore absorption of short-wavelength visible light by the transparent electrode layer is reduced to suppress deterioration of visibility due to coloring of a screen image, or the like.

Generally, when the thickness of the transparent electrode layer formed by sputtering is 20 nm or less, the initial deposition portion tends to significantly affect film quality, leading to an increase in resistivity. On the other hand, according to the manufacturing method of the present invention, a transparent electrode layer having a small thickness and a low resistance is obtained because the resistivity is kept low even when the thickness is 20 nm or less.

The content of tin oxide in the transparent electrode layer is preferably 3 to 13% by weight based on the total amount of indium oxide and tin oxide. A content of tin oxide of 3 to 7% by weight is especially preferred because crystallization of ITO after deposition can be performed in a short time. In the prior technique, when the content of tin oxide is 7% or less, the concentration of carriers in the film is low, so that it is difficult to reduce the resistivity to less than $3\times10^{-4}$ Ωcm. On the other hand, according to the present invention, the effective exhaust rate and the like during deposition can be adjusted to allow the resistivity to fall within the range of 2 to $3\times10^{-4}$ Ωcm even when the thickness is 20 nm or less, or even 17 nm or less.

According to the present invention, a crystallizable ITO film can be obtained even when the content of tin oxide exceeds 7% by weight. Generally, when the content of tin oxide in ITO is increased, the density of carriers in the film tends to be increased, leading to a reduction in resistivity. On the other hand, tin oxide can act as an impurity that hinders crystallization of indium oxide, and therefore when the content of tin oxide increases, crystallization tends to be difficult. Therefore, in the prior technique, when the content of tin oxide exceeds 7% by weight, heating at a high temperature and for a long time is required for crystallization, so that it is difficult to obtain a low-resistance ITO film on an industrial scale. On the other hand, according to the manufacturing method of the present invention, deposition conditions of an ITO film are adjusted, so that even when the content of tin oxide is high, an ITO film is obtained which is crystallizable under heating conditions similar to those where the content of tin oxide is low. Therefore, according to the present invention, a transparent electrode layer having a high tin oxide content and a lower resistance can be obtained. For obtaining a transparent electrode layer having a lower resistance, the content of tin oxide is preferably more than 7% by weight and not more than 13% by weight, more preferably more than 8% by weight and not more than 12% by weight, further preferably 9% by weight to 12% by weight based on the total amount of indium oxide and tin oxide.

<Crystallization of Transparent Electrode Layer>

Preferably, the transparent electrode layer 2 formed on the transparent film substrate 1 is crystallized for reducing the resistance. For example, the transparent film substrate 1 is heated together with the transparent electrode layer 2 formed thereon, to crystallize ITO that forms the transparent electrode layer 2. Although conditions for crystallization are not particularly limited, heating is preferably performed under an oxygen-present atmosphere. The heating temperature is preferably 200° C. or lower. The heating temperature is preferably equal to or lower than the softening point of the substrate. The heating treatment is performed, for example, in an oven at 120° C. to 150° C. for 30 to 60 minutes. Alternatively, heating may be performed at a relatively low temperature for a long time, for example, at a lower temperature (e.g. about 50° C. to 120° C.) for 2 hours to 3 days.

[Intended End-Use of Substrate with Transparent Electrode]

The substrate with a transparent electrode layer of the present invention has a low resistance and thus preferably used as a transparent electrode for liquid crystal displays, organic light emitting displays, touch panels, solar cells and so on. Above all, the substrate with a transparent electrode layer is preferably used for position detecting electrodes of capacitance touch panels.

When used as a position detecting electrode of a capacitance touch panel, the electrode is patterned into electrode-layer-formed parts and electrode-layer-non-formed parts. For example, after the formation of the transparent electrode layer, the patterning is performed by removing the transparent electrode layer by etching or the like in a part of the plane so that the electrode layer-non-formed parts are constituted. The method for etching the transparent electrode layer may be a wet process or a dry process. The wet process is suitable in that only the transparent electrode layer is easily and selectively removed. The patterning of the transparent electrode may be performed before or after the crystallization.

In formation of a touch panel, an electroconductive ink or paste is applied onto the substrate with a transparent electrode to form a wiring for a routing circuit. The wiring for a routing circuit may be formed by a dry coating method. When the wiring for a routing circuit is formed by photolithography, the wiring can be made thinner.

EXAMPLES

The present invention will be described more specifically below by showing examples, but the present invention is not limited to these examples.

In the following Examples and Comparative Examples, conditions other than the oxygen flow rate were fixed, and only the oxygen flow rate was changed to find an oxygen flow rate that led to the minimum sheet resistance. This oxygen flow rate was used as an oxygen flow rate during deposition of a transparent electrode layer.

For the substrate temperature during deposition, a temperature measuring label (TEMP-PLATE manufactured by I.P. LABORATORIES, INC) was attached to a substrate beforehand, and after completion of deposition, a value was read to measure a maximum temperature of the substrate during deposition. The thickness of a transparent electrode layer was determined by making a spectroscopic ellipsometry measurement and performing fitting using a Cauchy model and a Tauc-Lorentz model.

After a transparent electrode layer was formed, the transparent electrode layer was heated together with the substrate in an oven at 150° C. for 60 minutes, and cooled to room temperature, and the surface resistance of the transparent electrode layer was then measured by four-point probe measurement using a low resistivity meter Loresta GP (MCP-T710 manufactured by Mitsubishi Chemical Corporation).

Examples 1 and 2 and Comparative Examples 1 and 2

In Examples 1 and 2 and Comparative Examples 1 and 2 below, a substrate with a transparent electrode was prepared using a target having a tin oxide content of 5% by weight.

Example 1

A transparent film substrate with a hard coat layer formed on each of both surfaces of a PET film was provided, and an inorganic insulating layer and a transparent electrode layer were formed on the transparent film substrate using a roll-to-roll sputtering apparatus. First, the PET film substrate was loaded into a deposition apparatus, the inside of a deposition chamber was then decompressed, and the film was conveyed in vacuum with a back pressure of $7\times10^{-4}$ Pa.

Thereafter, using SiC as a target, sputtering was performed under conditions of an oxygen introduction rate of 50 sccm, an argon introduction rate of 120 sccm, a substrate temperature of 25° C., a chamber pressure of 0.2 Pa and a power density of 4.0 W/cm$^2$ to form an SiO$_x$ layer as an inorganic insulating layer. The obtained SiO$_x$ layer had a thickness of 20 nm.

Using a mix-sintered target of indium oxide and tin oxide (content of tin oxide: 5% by weight), sputtering was performed with an oxygen introduction rate of 5 sccm, an argon introduction rate of 600 sccm, a chamber pressure of 0.3 Pa and a power density of 1.5 W/cm$^2$ to form on the SiO$_x$ a transparent electrode layer formed of ITO. The effective exhaust rate during deposition was 3400 L/second, and the maximum substrate temperature read from the temperature measuring label was 60° C. or lower.

The thickness of the transparent electrode layer as measured by spectroscopic ellipsometry was 12 nm, the sheet resistance after crystallization was 226 Ω/sq, and the resistivity was $2.7\times10^{-4}$ Ωcm.

Example 2

A substrate with a transparent electrode was obtained in the same manner as in Example 1 except that the thickness of the transparent electrode was 15 nm. The resistivity of the transparent electrode layer after crystallization was $2.5\times10^{-4}$ Ωcm.

Comparative Example 1

A substrate with a transparent electrode was obtained in the same manner as in Example 1 except that the thickness of the transparent electrode was 20 nm, the oxygen introduction rate was 3.0 sccm, the argon introduction rate was 300 sccm, and the chamber pressure was 0.3 Pa. The effective exhaust rate during deposition was 850 L/second. The resistivity of the transparent electrode layer after crystallization was $4.3\times10^{-4}$ Ωcm.

Comparative Example 2

A substrate with a transparent electrode was obtained in the same manner as in Example 2 except that the oxygen introduction rate was 1.0 sccm, and the argon introduction rate was 160 sccm. The effective exhaust rate during deposition was 900 L/second. The resistivity of the transparent electrode layer after crystallization was $10.4\times10^{-4}$ Ωcm.

Deposition conditions of the transparent electrode layers of Examples 1 and 2 and Comparative Examples 1 and 2, and film characteristics of the respective transparent electrode layers are shown in Table 1.

TABLE 1

| | Deposition Conditions | | | | | | | Film Properties | |
|---|---|---|---|---|---|---|---|---|---|
| | Tin oxide content (wt %) | Pressure (Pa) | Ar Flow rate (sccm) | O$_2$ Flow rate (sccm) | Effective exhaust rate (L/s) | Exhaust rate cycle (1/s) | Power density (W/cm$^2$) | Effective exhaust rate/ area of sputtering target (L/s/cm$^2$) | Thickness (nm) | Resistivity ($\times10^{-4}$ Ωcm) |
| Example 1 | 5 | 0.3 | 600 | 5 | 3404 | 0.9 | 1.5 | 2.6 | 12 | 2.7 |
| Example 2 | 5 | 0.3 | 600 | 5 | 3404 | 0.9 | 1.5 | 2.6 | 15 | 2.5 |
| Comparative Example 1 | 5 | 0.6 | 300 | 3 | 852 | 0.3 | 1.5 | 0.6 | 20 | 4.3 |
| Comparative Example 2 | 5 | 0.3 | 160 | 1 | 906 | 0.3 | 1.5 | 0.7 | 15 | 10.8 |

In Examples 1 and 2 with the effective exhaust rate set to about 3400 L/second, a low-resistance transparent electrode having a resistivity of less than $3\times10^{-4}$ Ωcm after crystallization was obtained although the thickness was as small as 12 nm or 15 nm. In Comparative Examples 1 and 2, the resistivity exceeded $3\times10^{-4}$ Ωcm because the effective exhaust rate during deposition was low although the transparent electrode layer had a larger thickness than that in Example 1. From these results, it has been shown that the gas flow rate, the chamber pressure and the exhaust rate during deposition can be properly set to thereby form a low-resistance ITO film on a film substrate even when the thickness is small and the tin oxide content is low.

Examples 3 to 5 and Comparative Examples 3 to 5

Next, the content of tin oxide was increased to 10%, and deposition conditions of the transparent electrode layer were changed to examine a relationship between deposition conditions and the resistivity.

In the same manner as in Example 1, an SiO$_x$ layer having a thickness of 20 nm was formed on a PET film, and an ITO transparent electrode layer was formed thereon under sputtering conditions shown in Table 2 using a mixed sintered target of indium oxide and tin oxide (tin oxide content: 10% by weight) and crystallized by heating. Deposition conditions and film characteristics are shown in Table 2.

TABLE 2

| | Deposition Conditions | | | | | | | Film Properties | |
|---|---|---|---|---|---|---|---|---|---|
| | Tin oxide | | Ar | $O_2$ | Effective exhaust | Exhaust | Power | Effective exhaust rate/ area of sputtering target | | |
| | content (wt %) | Pressure (Pa) | Flow rate (sccm) | Flow rate (sccm) | rate (L/s) | rate cycle (1/s) | density (W/cm$^2$) | target (L/s/cm$^2$) | Thickness (nm) | Resistivity (×10$^{-4}$ Ωcm) |
| Example 3 | 10 | 0.36 | 600 | 5 | 2837 | 0.7 | 1.5 | 2.1 | 23 | 2.8 |
| Example 4 | 10 | 0.23 | 400 | 4 | 2965 | 0.7 | 1.5 | 2.2 | 20 | 2.3 |
| Example 5 | 10 | 0.6 | 1000 | 6 | 2830 | 0.7 | 1.5 | 2.1 | 22 | 2.8 |
| Comparative Example 3 | 10 | 0.3 | 160 | 1 | 906 | 0.3 | 1.5 | 0.7 | 15 | 4.6 |
| Comparative Example 4 | 10 | 0.3 | 160 | 2 | 912 | 0.3 | 1.5 | 0.7 | 18 | 4.6 |
| Comparative Example 4 | 10 | 0.3 | 160 | 2 | 912 | 0.3 | 2.3 | 0.7 | 24 | 3.9 |

In each of Comparative Examples 3 to 5 with the effective exhaust rate set to about 900 L/second, the resistivity of the transparent electrode layer exceeded 3×10$^{-4}$ Ωcm, and the resistivity tended to increase when the thickness was small.

On the other hand, in each of Examples 3 to 5, the resistivity of the transparent electrode layer was less than 3×10$^{-4}$ Ωcm. In Example 5, both the argon flow rate and the chamber pressure were increased by a factor of about 1.7 as compared to Example 3, and therefore the effective exhaust rate was almost equal to that in Example 3, and the resistivity of the obtained transparent electrode layer was also comparable to that in Example 3. From these results, it is apparent that even when the tin oxide content is high, a transparent electrode layer having a low resistance is obtained by increasing the effective exhaust rate.

Examples 6 to 10

Next, for examining a relationship between deposition conditions and the resistivity in the case of using deposition apparatuses having different deposition chamber volumes, deposition was performed using a sputtering target having a tin oxide content of 10% (having a target area smaller than those in Examples 3 to 5 described above) by a roll-to-roll sputtering apparatus having a deposition chamber volume smaller than those in the Examples and Comparative Examples described above. An ITO transparent electrode layer was formed on an SiO$_x$ layer formed on a PET film substrate under sputtering conditions shown in Table 3, and was crystallized by heating. Deposition conditions and film characteristics are shown in Table 3.

TABLE 3

| | Deposition Conditions | | | | | | | Film Properties | |
|---|---|---|---|---|---|---|---|---|---|
| | Tin oxide | | Ar | $O_2$ | Effective exhaust | Exhaust | Power | Effective exhaust rate/ area of sputtering target | | |
| | content (wt %) | Pressure (Pa) | Flow rate (sccm) | Flow rate (sccm) | rate (L/s) | rate cycle (1/s) | density (W/cm$^2$) | target (L/s/cm$^2$) | Thickness (nm) | Resistivity (×10$^{-4}$ Ωcm) |
| Example 6 | 10 | 0.3 | 250 | 2 | 1418 | 1.4 | 0.6 | 4.2 | 20 | 2.6 |
| Example 7 | 10 | 0.3 | 250 | 2 | 1418 | 1.4 | 0.6 | 4.2 | 16 | 2.5 |
| Example 8 | 10 | 0.3 | 250 | 2 | 1418 | 1.4 | 3.0 | 4.2 | 22 | 2.2 |
| Example 9 | 10 | 0.6 | 500 | 3 | 1415 | 1.4 | 0.6 | 4.2 | 22 | 2.0 |
| Example 10 | 10 | 0.3 | 250 | 2 | 1418 | 1.4 | 0.6 | 4.2 | 24 | 2.5 |

The results in Table 3 show that even when the volume of the chamber is changed, a transparent electrode layer having a low resistance is obtained as long as the effective exhaust rate is 1200 L/second or more. In Example 8, deposition was performed with a higher power density than those in other Examples, but a transparent electrode layer having a low resistance was obtained as in other examples. Also in Example 9 where both the chamber pressure and the gas flow rate were increased, a transparent electrode layer having a low resistance was obtained as in other Examples.

DESCRIPTION OF REFERENCE CHARACTERS 1 transparent film substrate
11 transparent film base
12 inorganic insulating layer
2 transparent electrode

The invention claimed is:
1. A method for manufacturing a substrate with a transparent electrode in which a transparent electrode layer is provided on a transparent film substrate,
  the method comprising:
    a deposition step of forming the transparent electrode layer on the transparent film substrate by a sputtering method, the transparent electrode layer being formed of indium tin oxide; and a crystallization step of crystallizing the transparent electrode layer, wherein in the deposition step, roll to roll sputtering deposition is performed using a sputtering target containing a sintered body of a solid dispersion of indium oxide and tin oxide while a sputtering gas containing argon and oxygen is introduced into a chamber, an introduction rate Q of the sputtering gas introduced into the chamber is 200 sccm to 1500 sccm, and a pressure P in the chamber is 0.2 to 0.6 Pa, and an effective exhaust rate S determined from the introduction rate Q of the sputtering gas and the pressure P in the chamber in accordance with the following formula is 1200 to 5000 (L/second):

$$S(\text{L/second})=1.688 \times Q(\text{sccm})/P(\text{Pa}).$$

2. The method for manufacturing the substrate with the transparent electrode according to claim 1, wherein a value obtained by dividing the effective exhaust rate S by an area of the sputtering target is 1 L/second·cm² to 5 L/second·cm².

3. The method for manufacturing the substrate with the transparent electrode according to claim 1, wherein an exhaust rate cycle Ec obtained by dividing the effective exhaust rate S by a volume V of the chamber is 0.4/second or more.

4. The method for manufacturing the substrate with the transparent electrode according to claim 1, wherein a thickness of the transparent electrode layer is 10 to 20 nm.

5. The method for manufacturing the substrate with the transparent electrode according to claim 1, wherein the transparent film substrate includes an inorganic insulating layer on a surface on which the transparent electrode layer is formed.

6. The method for manufacturing the substrate with the transparent electrode according to claim 5, wherein the inorganic insulating layer is $SiO_x$, wherein x is 1.8 to 2.0.

7. The method for manufacturing the substrate with the transparent electrode according to claim 1, wherein a substrate temperature in the deposition step is 100° C. or lower.

8. The method for manufacturing the substrate with the transparent electrode according to claim 1, wherein heating is performed at a temperature of 200° C. or lower in the crystallization step.

9. The method for manufacturing the substrate with the transparent electrode according to claim 1, wherein the transparent electrode layer after the crystallization step has a resistivity of less than $3 \times 10^{-4}$ Ω cm.

10. The method for manufacturing the substrate with the transparent electrode according to claim 1, wherein a content of tin oxide in the sputtering target is 3 to 13% by weight based on a total amount of indium oxide and tin oxide.

* * * * *